(12) United States Patent
Tanaka et al.

(10) Patent No.: US 6,574,101 B2
(45) Date of Patent: Jun. 3, 2003

(54) PORTABLE ELECTRONIC DEVICE CAPABLE OF EFFICIENTLY COOLING HEAT-GENERATION ELECTRONIC COMPONENT

(75) Inventors: Wataru Tanaka, Kawasaki (JP); Ikki Tatsukami, Kawasaki (JP); Takashi Iijima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 98 days.

(21) Appl. No.: 09/794,016

(22) Filed: Feb. 28, 2001

(65) Prior Publication Data
US 2001/0040789 A1 Nov. 15, 2001

(30) Foreign Application Priority Data
May 12, 2000 (JP) ........................................ 2000-139753

(51) Int. Cl.[7] ................................................ G06F 1/16
(52) U.S. Cl. ........................ 361/687; 361/695; 361/697; 165/80.3
(58) Field of Search ................................ 361/687, 695, 361/697, 699, 700; 165/122–126, 80.3; 174/15.2

(56) References Cited

U.S. PATENT DOCUMENTS 5,557,500 A  * 9/1996 Baucom et al. ............. 361/687
5,973,920 A  * 10/1999 Altic et al. ................. 165/80.2
6,049,455 A  * 4/2000 Nakamura et al. ......... 165/80.3
6,054,198 A  * 4/2000 Bunyan et al. ............. 156/247
6,188,131 B1 * 2/2001 Nereng ....................... 257/706
6,205,025 B1 * 3/2001 Chen ......................... 165/80.3
6,223,815 B1 * 5/2001 Shibasaki ................... 165/185
6,226,179 B1 * 5/2001 Lee ............................ 165/80.2
6,241,007 B1 * 6/2001 Kitahara et al. ............ 165/185

FOREIGN PATENT DOCUMENTS

JP          63-250900       10/1988
JP          8-87348         4/1996

* cited by examiner

Primary Examiner—Darren Schuberg
Assistant Examiner—Anthony Q. Edwards
(74) Attorney, Agent, or Firm—Armstrong, Westerman & Hattori, LLP

(57) ABSTRACT

A portable electronic device includes a casing, a metal made main frame contained in the casing, a printed circuit board contained in the casing in such a manner as to be directed substantially in parallel to the main frame, and a heat-generation component mounted on the printed circuit board. The portable electronic device further includes a cooling device disposed in contact with the heat-generation component for cooling the heat-generation component, a metal made fixture for fixing the cooling device to the main frame, and a spring, interposed between the main frame and the printed circuit board, for pushing the heat-generation component to the cooling device, thereby bringing the heat-generation component into area-contact with the cooling device.

12 Claims, 6 Drawing Sheets

PORTABLE ELECTRONIC DEVICE CAPABLE OF EFFICIENTLY COOLING HEAT-GENERATION ELECTRONIC COMPONENT

BACKGROUND OF THE INVENTION

1. Field of the Invention

The present invention generally relates to a portable electronic device, and particularly to a cooling structure for cooling a heat-generation electronic component of a portable electronic device such as a notebook personal computer or a laptop computer.

2. Description of the Related Art

Recently, with the widespread use of notebook personal computers for improving the efficiencies of tasks, there has been a strong demand toward multi-function of the computers. To satisfy such a demand, the packing densities of printed circuit boards built in notebook personal computers have become higher, and consequently electronic components liable to generate large amounts of heat have come to be mounted on the printed circuit boards at high densities. Further, in notebook personal computers, the power consumptions of integrated circuits have been increased due to high clocking thereof, and correspondingly the heat-generation amounts thereof have been increased. From this viewpoint, it has been required to effectively cool such heat-generation electronic components. In particular, for notebook type or laptop type portable information processing devices, heat-generation components are concentratedly built in a main body portion, and accordingly, when the portable information processing device is placed on a desk for example, heat is less escaped from the bottom surface of the main body portion, resulting in the temperature rise of the bottom surface of the main body portion.

In the recent portable information processing devices, the heat-generation amount of a CPU tends to be increased due to a higher operational frequency of the CPU, and to efficiently radiate such heat, it is effective to make use of the forced air-cooling by a cooling fan. For example, a technique has been known, in which a fan heat sink integrated with a plurality of radiating fins and containing a cooling fan is brought into area-contact with a CPU, whereby the CPU is forcibly air-cooled by the cooling fan.

This prior art cooling structure for heat-generation components is configured such that mounting fixtures are disposed on the back surface of a printed circuit board on which the CPU is mounted, and the fan heat sink is fixed to the mounting fixtures by screwing in a state in which the printed circuit board is held between the fan heat sink and the mounting fixtures. In the cooling structure, to ensure a sufficient degree of adhesion between the fan heat sink and the CPU, coil springs are inserted between the mounting fixtures and a plurality of portions, to be screwed, of the fan heat sink, whereby the fan heat sink is pressed toward the printed circuit board by biasing forces of the coil springs.

Since most of heat generated from a CPU is radiated via a heat sink, the heat sink must be enlarged with an increase in heat-generation amount of the CPU, which inevitably leads to enlargement of an electronic device including the CPU. Such enlargement of the heat sink, however, is undesirable because it is most essential to reduce the size and weight of a portable information processing device.

SUMMARY OF THE INVENTION

An object of the present invention is to provide a portable electronic device capable of efficiently radiating heat generated from a heat-generation component.

Heat generated from a heat-generation component such as a CPU mounted on an electronic device can be expected to be radiated not only by the forced air-cooling due to air blasting by a fan of a fan heat sink but also by thermal transfer from a main body of the heat sink to another component and spontaneous emission to atmosphere.

In accordance with an aspect of the present invention, there is provided a portable electronic device including: a casing; a metal made main frame contained in the casing; a printed circuit board contained in the casing in such a manner as to be directed substantially in parallel to the main frame; a heat-generation component mounted on the printed circuit board; a cooling device disposed in contact with the heat-generation component for cooling the heat-generation component; and a metal made fixture for fixing the cooling device to the main frame.

With this configuration, since the cooling device is directly connected to the main frame, heat generated from the heat-generation component is transferred to the main frame via the cooling device, and is radiated from the main frame. The main frame having a large heat capacity and a large surface area functions as an optimal radiating member. In this way, according to the present invention, heat generated from the heat-generation component mounted on the portable electronic device can be efficiently radiated.

In accordance with another aspect of the present invention, there is provided a cooling structure for an electronic device having a heat-generation component, including: a metal made main frame; a printed circuit board on which the heat-generation component is mounted, the printed circuit board being mounted substantially in parallel to the main frame; a cooling device disposed in contact with the heat-generation component for cooling the heat-generation component; and a metal made fixture for fixing the cooling device to the main frame.

The above and other objects, features and advantages of the present invention and the manner of realizing them will become more apparent, and the invention itself will best be understood from a study of the following description and appended claims with reference to the attached drawings showing some preferred embodiments of the invention.

DESCRIPTION OF THE PREFERRED EMBODIMENTS

Figure 1:
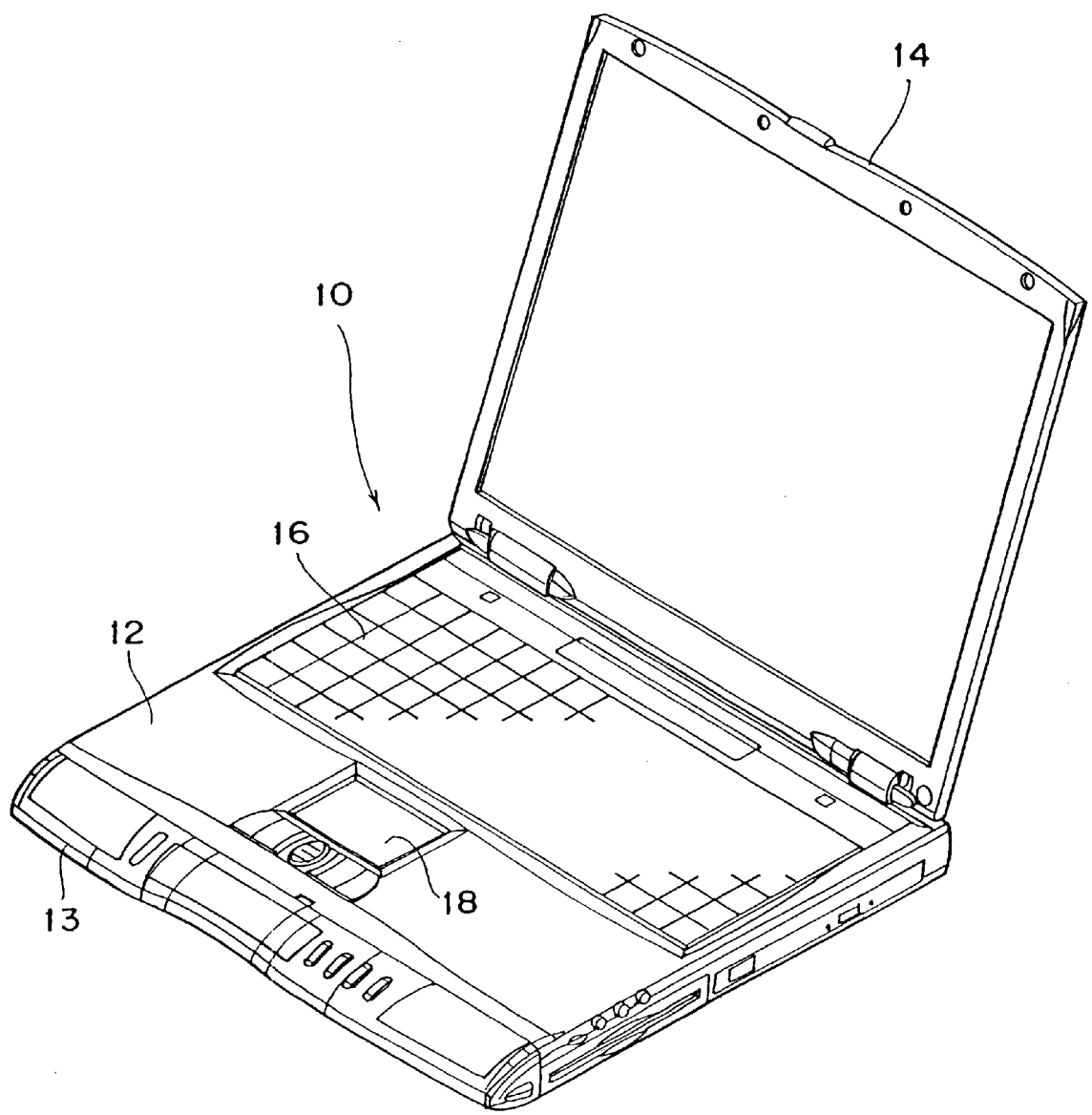
FIG. 1 is a perspective view of a notebook personal computer to which the present invention is applied.

FIG. 1 shows an external appearance of a notebook personal computer 10 configured as one example of a portable electronic device of the present invention. The notebook personal computer 10 has a main body 12 in which circuit components typically a central processing unit (CPU) are built and a liquid crystal display device 14 swingably mounted to the main body 12. The main body 12 includes a casing 13, a keyboard 16, and a pointing device 18. To execute software incorporated in the main body 12 of the notebook personal computer 10, a user operates the keyboard 16 and the pointing device 18 for inputting necessary demands and information. The result of processing software is displayed on the liquid crystal display device 14.

Figure 2:
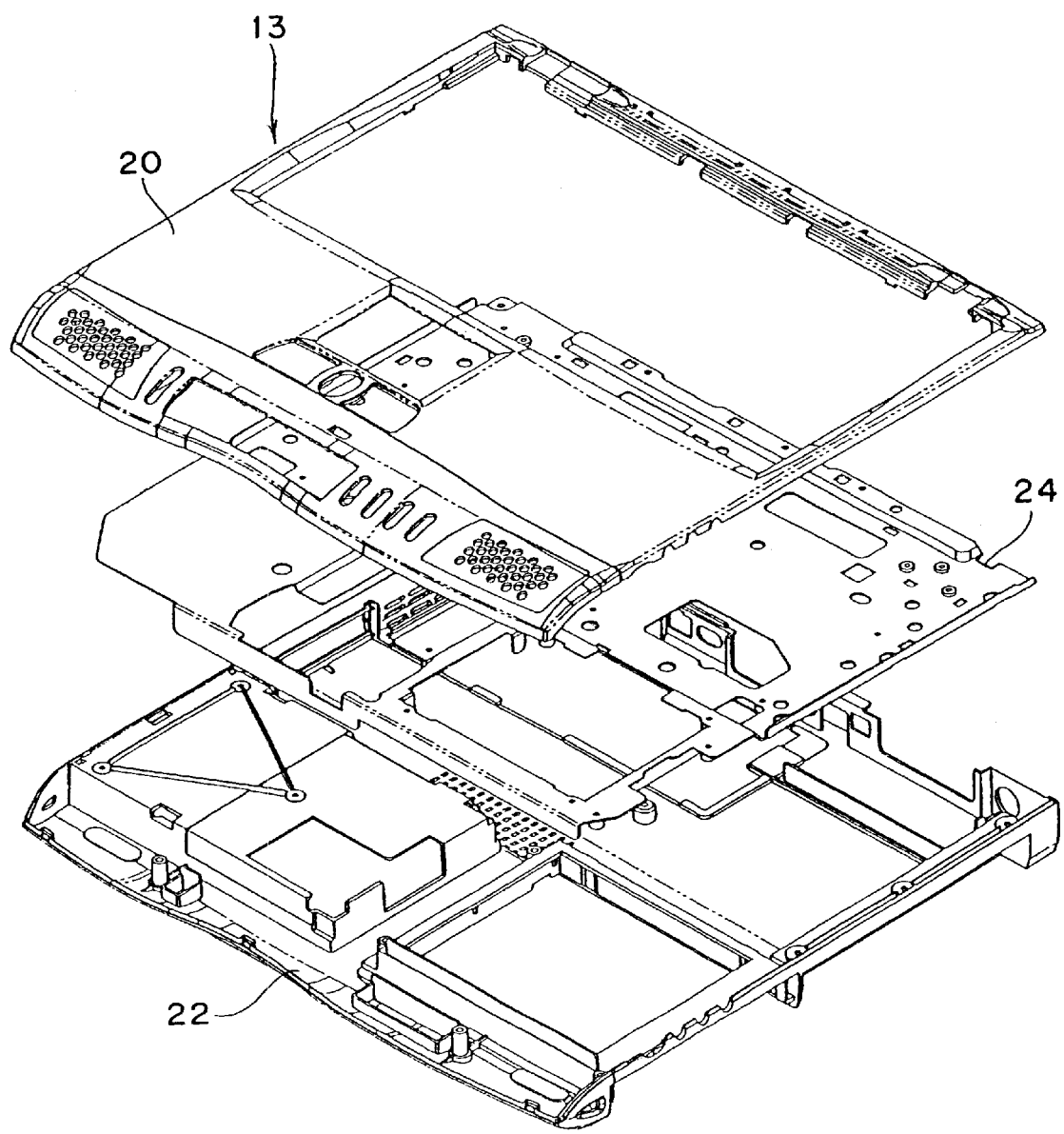
FIG. 2 is an exploded view in perspective of a casing of the notebook personal computer.
Figure 3:
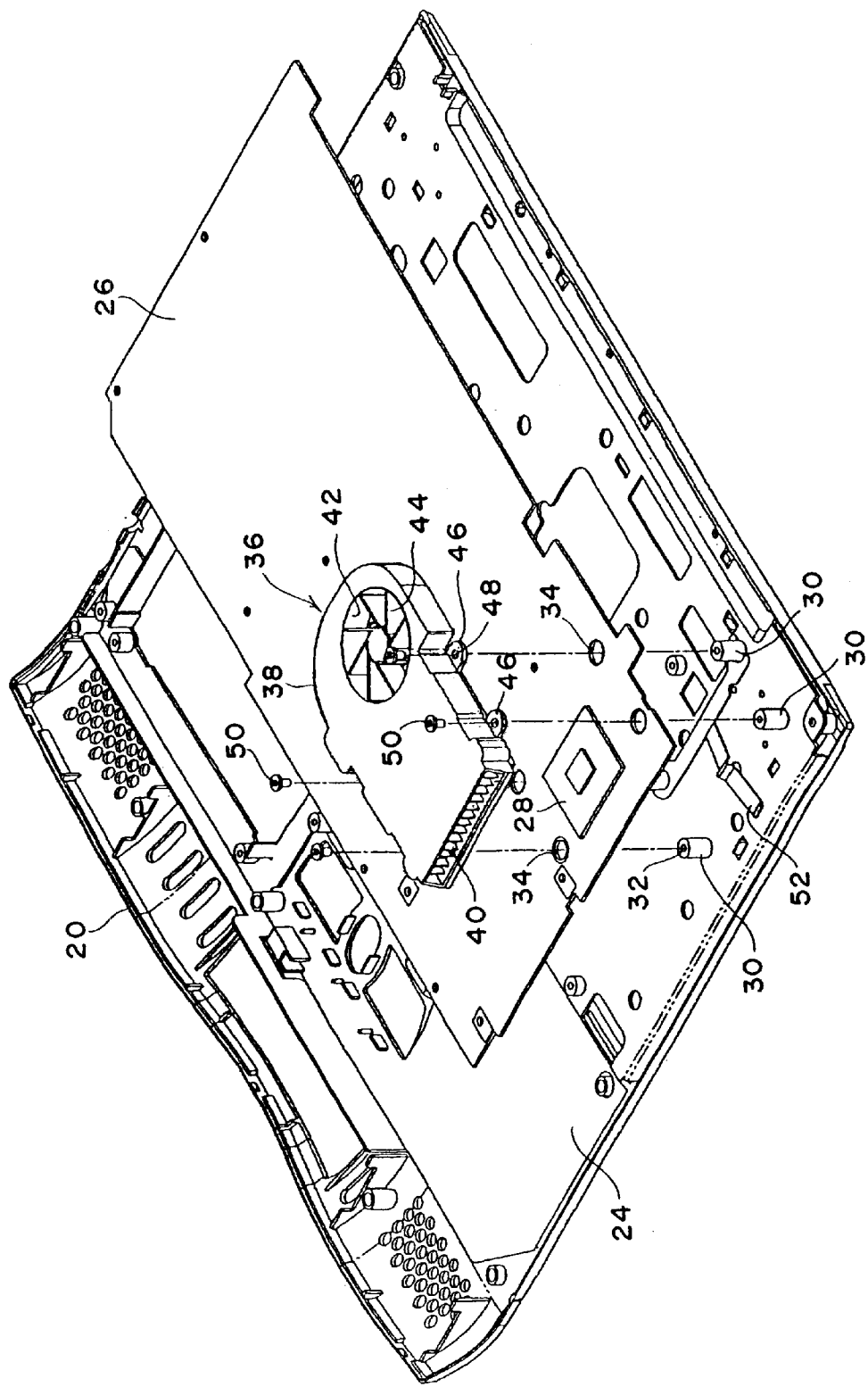
FIG. 3 is an exploded view in perspective of a cooling structure according to an embodiment of the present invention.
Figure 4:
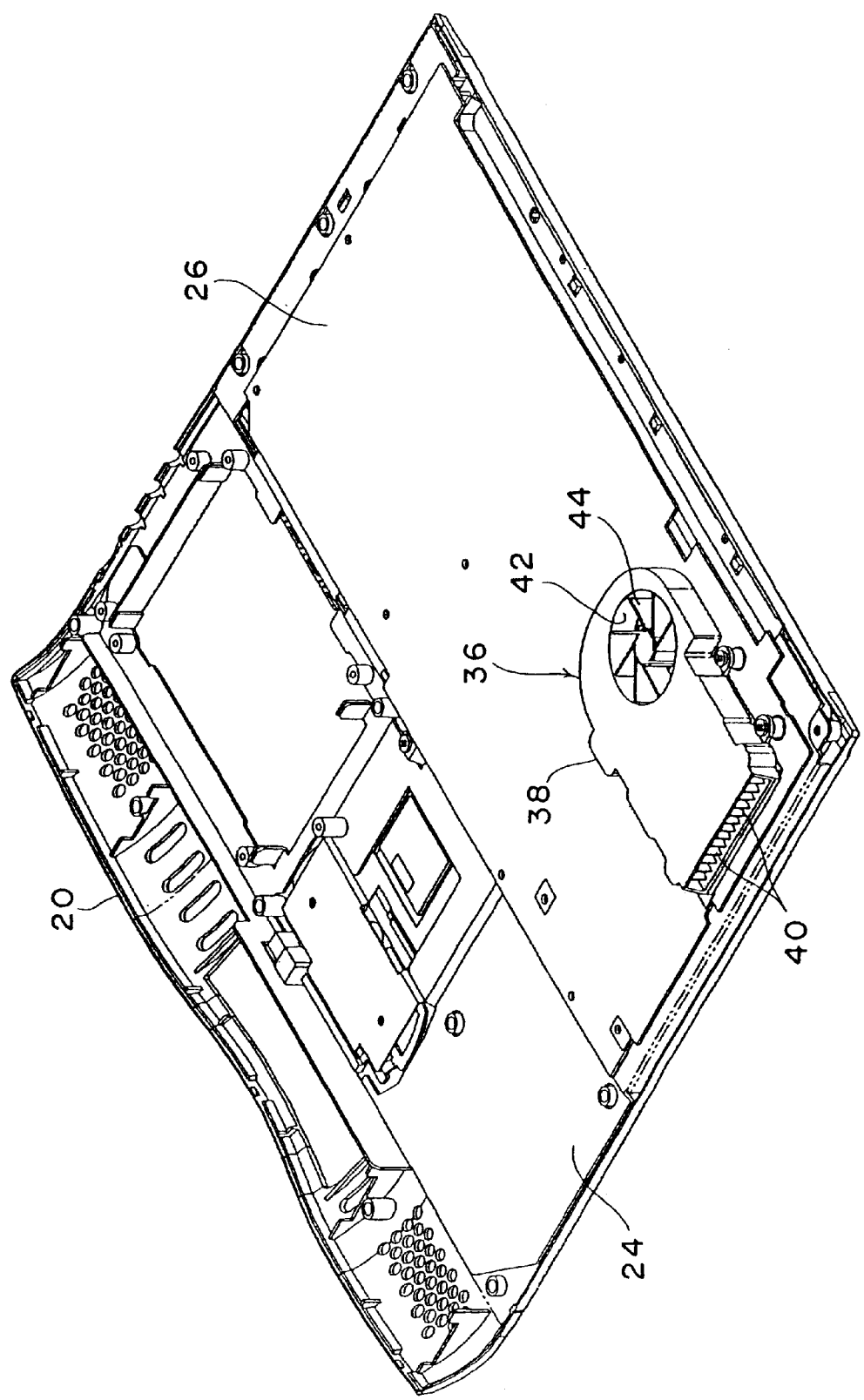
FIG. 4 is a perspective view of the cooling structure shown in FIG. 3.

FIG. 2 is an exploded view in perspective of the casing 13. The casing 13 has an upper cover 20 and a lower cover 22. A main frame 24 made from a metal such as aluminum is contained in the casing 13. FIG. 3 is an exploded view in perspective of a cooling structure according to an embodiment of the present invention, and FIG. 4 is a perspective view of the cooling structure.

A CPU 28 representative of heat-generation components is mounted on a printed circuit board 26. The CPU 28 is typically configured as the Pentium III (registered trademark of Intel Corporation) microprocessor unit. The main frame 24 has four metal rods 30 fixed thereto by caulking for example. Each rod 30 has a threaded hole 32. The printed circuit board 26 has four holes 34 allowing the rods 30 to pass therethrough.

Figure 5:
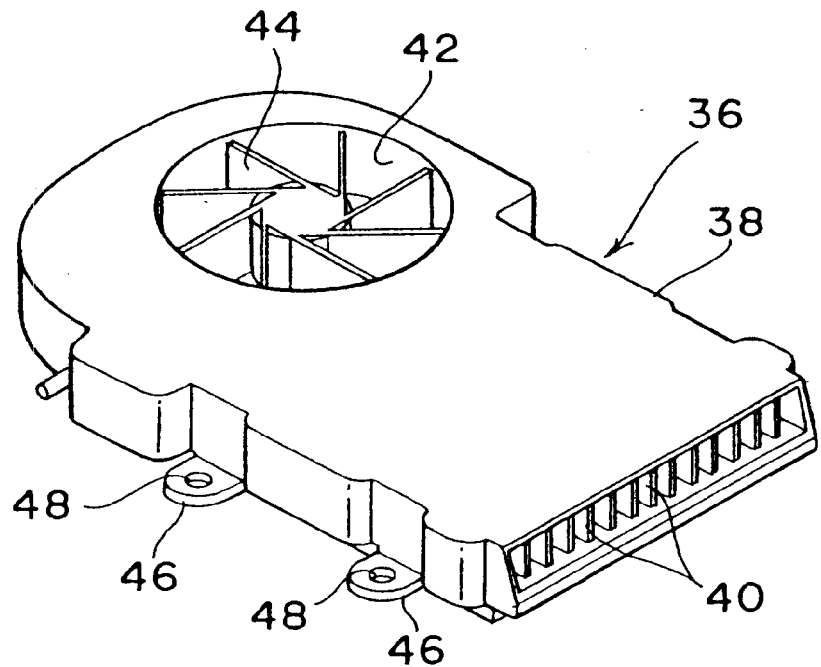
FIG. 5A is a perspective view showing a front surface side of a heat sink.
FIG. 5B is a perspective view showing a back surface side of the heat sink.
Figure 5:
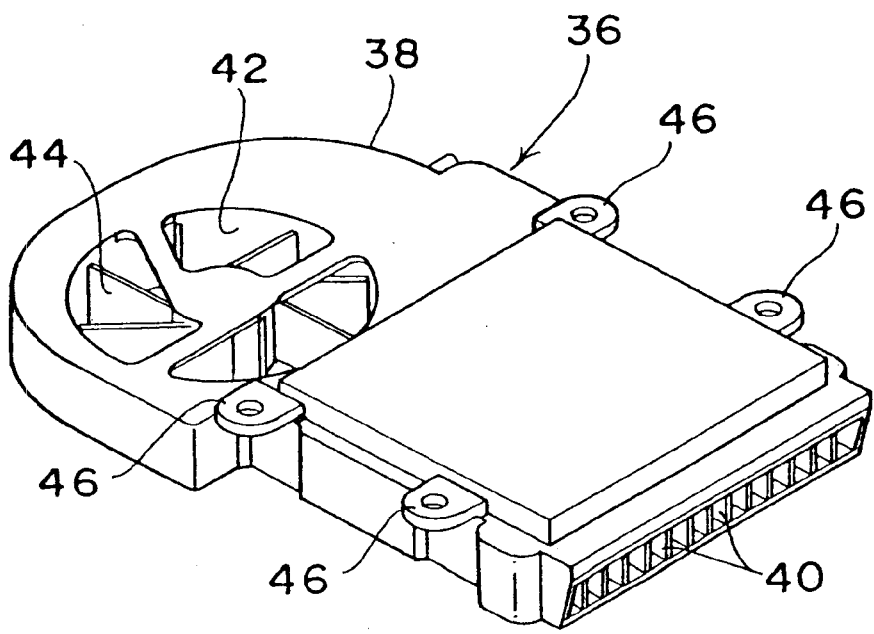

Reference numeral 36 designates a heat sink as a cooling device. A main body 38 of the heat sink 36 is produced by die-casting aluminum. FIG. 5A is a perspective view showing a front surface side of the heat sink 36, and FIG. 5B is a perspective view showing a back surface side of the heat sink 36. The heat sink 36 has a plurality of radiating fins 40 formed integrally with the main body 38 and four mounting brackets 46. Each mounting bracket 46 has a hole 48. The main body 38 has an opening 42, in which a fan 44 made from a synthetic resin for example is rotatably mounted.

Figure 6:
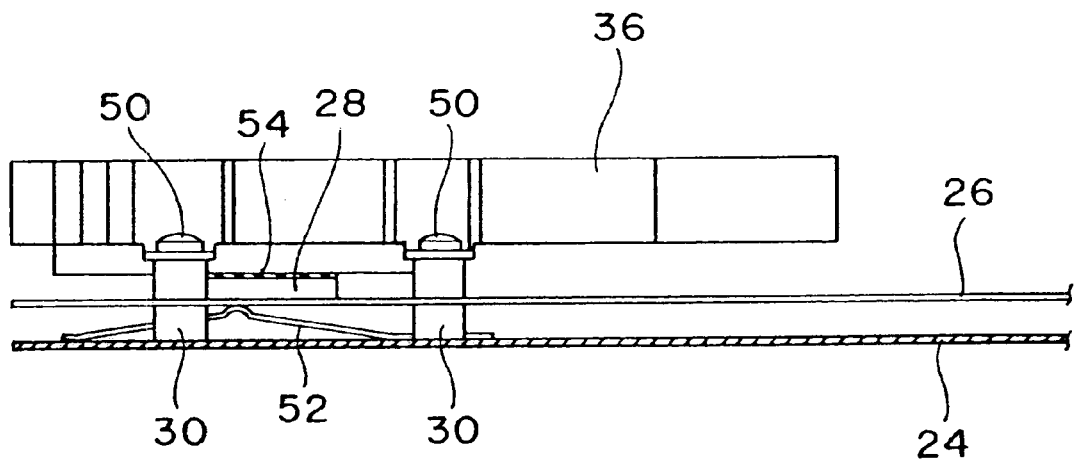
FIG. 6 is a sectional view schematically showing a heat sink mounting structure according to an embodiment of the present invention.
Figure 7:
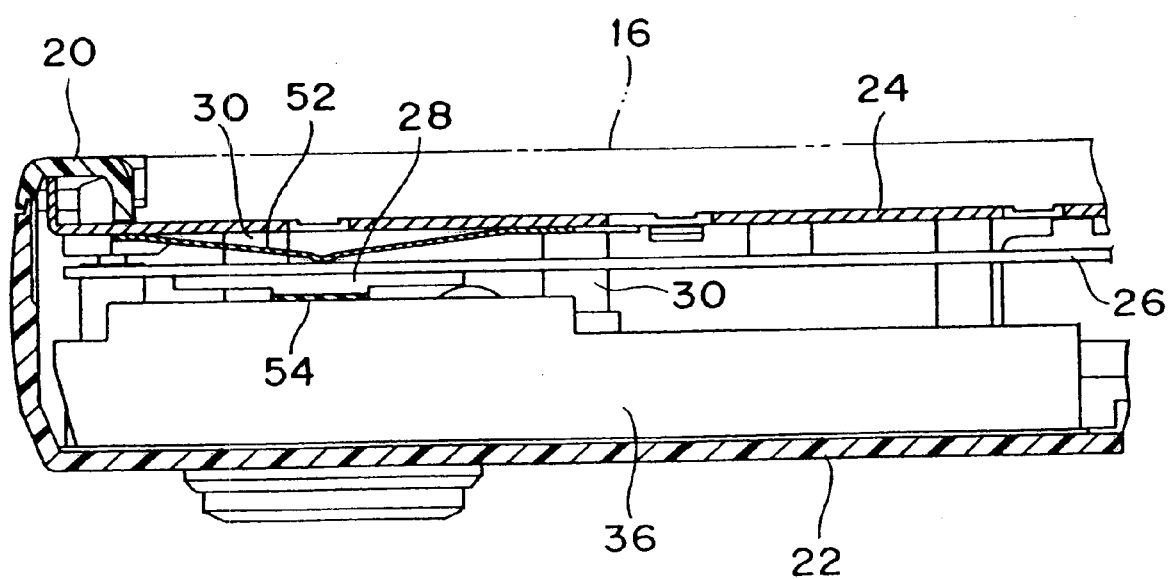
FIG. 7 is a sectional view showing details of the heat sink mounting structure shown in FIG. 6.

FIG. 6 is a schematic view showing a heat sink mounting structure, and FIG. 7 is a view showing details of the heat sink mounting structure. The mounting structure shown in FIG. 7 is depicted as inverted from that shown in FIG. 6. The heat sink 36 is mounted on the rods 30 fixed to the main frame 24, and the brackets 46 of the heat sink 36 are fastened to the rods 30 with screws 50. A plate spring 52 is interposed between the main frame 24 and the printed circuit board 26. When the screws 50 are screwed in the threaded holes 32 of the rods 30, a biasing force acting in the direction perpendicular to the printed circuit board 26 is imparted to the CPU or heat-generation component 28, to press the heat-generation component 28 to the heat sink 36. A high thermal conductive rubber member 54 is interposed between the heat sink 36 and the heat-generation component 28, to ensure a sufficient degree of adhesion in area-contact between the heat-generation component 28 and the heat sink 36.

Heat generated from the heat-generation component 28 mounted on the printed circuit board 26 is transferred to the heat sink 36. When the fan 44 is rotated, air is sucked in the heat sink 36 through the opening 42, and the sucked air is discharged therefrom via the radiating fins 40. The heat generated from the heat-generation component 28 is thus forcibly air-cooled by the fan 44 of the heat sink 36.

With this heat sink mounting structure according to this embodiment, since the heat sink 36 is directly mounted to the rods 30 fixed to the main frame 26, the heat of the heat sink 36 is transferred to the main frame 24 via the rods 30 and is radiated in air from the main frame 24. In this way, according to the cooling structure of this embodiment, since the heat of the heat sink 36 can be not only forcibly air-cooled by the fan 44 but also directly transferred to the main frame 24, the cooling performance can be improved.

In the above-described embodiment, the rods 30 are fixed to the main frame 24; however, the fixing means according to the present invention is not limited to the combination of the rods 30 and the screws 50. For example, the fixing means may be configured such that a plurality of bolts are fixed to the main frame 24 and the brackets 46 of the heat sink 36 are fixed to the bolts by using nuts. Although the present invention is applied to a notebook personal computer in the above-described embodiment, the invention is not limited thereto but may be widely applied to a mobile phone, a car navigation system, and the like.

As described above, according to the present invention, since heat generated from a heat-generation component mounted on a portable electronic device is radiated by making use of heat transfer through a metal made main frame in addition to the forced air-cooling by a fan of a heat sink, the portable electronic device can be efficiently cooled.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A portable electronic device comprising:
   a casing;
   a metal made main frame contained in said casing;
   a printed circuit board contained in said casing in such a manner as to be directed substantially in parallel to said main frame;
   a heat-generation component mounted on said printed circuit board;
   a cooling device disposed in contact with said heat-generation component for cooling said heat-generation component;
   a metal made fixture for fixing said cooling device to said main frame; and
   a biasing means, interposed between said main frame and said printed circuit board, for pushing said heat-generation component to said cooling device.

2. A portable electronic device according to claim 1, wherein said metal made fixture comprises a plurality of rods fixed to said main frame and a plurality of screws for fixing said cooling device to said rods.

3. A portable electronic device according to claim 1, wherein said metal made fixture comprises a plurality of bolts fixed to said main frame, and a plurality of nuts for fixing said cooling device to said bolts.

4. A portable electronic device according to claim 1, wherein said biasing means comprises a plate spring.

5. A portable electronic device according to claim 1, wherein said cooling device comprises a heat sink having a fan and a plurality of radiating fins.

6. A portable electronic device according to claim 1, further comprising a high thermal conductive member interposed between said heat-generation component and said cooling device.

7. A cooling structure for an electronic device having a heat-generation component, comprising:
   a metal made main frame;
   a printed circuit board on which said heat-generation component is mounted, said printed circuit board being mounted substantially in parallel to said main frame;

a cooling device disposed in contact with said heat-generation component for cooling said heat-generation component;

a metal made fixture for fixing said cooling device to said main frame; and a spring, interposed between said main frame and said printed circuit board, for pushing said heat-generation component to said cooling device.

8. A cooling structure for an electronic device according to claim 7, wherein said metal made fixture comprises a plurality of rods fixed to said main frame and a plurality of screws for fixing said cooling device to said rods.

9. A cooling structure for an electronic device according to claim 7, wherein said metal made fixture comprises a plurality of bolts fixed to said main frame, and a plurality of nuts for fixing said cooling device to said bolts.

10. A cooling structure for an electronic device according to claim 7, wherein said spring comprises a plate spring.

11. A cooling device for an electronic device according to claim 7, wherein said cooling device comprises a heat sink having a fan and a plurality of radiating fins.

12. A cooling device for an electronic device according to claim 7, further comprising a high thermal conductive member interposed between said heat-generation component and said cooling device.

* * * * *